(12) United States Patent
Ejiri

(10) Patent No.: US 6,525,401 B2
(45) Date of Patent: Feb. 25, 2003

(54) SEMICONDUCTOR DEVICE FOR INTEGRATED INJECTION LOGIC CELL AND PROCESS FOR FABRICATING THE SAME

(75) Inventor: Hirokazu Ejiri, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/778,313

(22) Filed: Feb. 7, 2001

(65) Prior Publication Data

US 2001/0035564 A1 Nov. 1, 2001

(30) Foreign Application Priority Data

Feb. 7, 2000 (JP) .................................. P2000-028531

(51) Int. Cl.[7] ............................................. H01L 27/082
(52) U.S. Cl. ...................... 257/565; 257/526; 257/577; 257/592; 257/632; 257/635; 257/640
(58) Field of Search ................. 257/565, 577, 257/592, 632, 635, 640, 649, 526

(56) References Cited

U.S. PATENT DOCUMENTS

| | | | |
|---|---|---|---|
| 3,962,717 A | | 6/1976 | O'Brien |
| 4,199,378 A | * | 4/1980 | van Gils ...................... 148/1.5 |
| 4,473,940 A | * | 10/1984 | Kiriseko ...................... 29/576 |
| 4,512,075 A | * | 4/1985 | Vora ............................ 29/577 |
| 4,590,666 A | * | 5/1986 | Goto ........................... 29/578 |
| 4,732,872 A | * | 3/1988 | Komatsu ...................... 437/47 |
| 5,188,972 A | | 2/1993 | Shum et al. |
| 5,858,850 A | * | 1/1999 | Gomi ......................... 438/314 |
| 6,008,524 A | * | 12/1999 | Gomi ......................... 257/575 |

FOREIGN PATENT DOCUMENTS

EP    843354 A1 *  5/1998

* cited by examiner

Primary Examiner—Nathan J. Flynn
Assistant Examiner—Remmon R. Fordé
(74) Attorney, Agent, or Firm—Sonnenschein, Nath & Rosenthal

(57) ABSTRACT

A semiconductor device for an integrated injection logic cell having a pnp bipolar transistor structure formed on a semiconductor substrate, wherein at least one layer of insulating films formed on a base region of the pnp bipolar transistor structure is comprised of a silicon nitride film. The semiconductor device of the present invention is advantageous in that the silicon nitride film constituting at least one layer of the insulating films formed on the base region of the pnp bipolar transistor prevents an occurrence of contamination on the surface of the base region, so that both the properties of the pnp bipolar transistor and the operation of the IIL cell can be stabilized. Further, by the process of the present invention, the above-mentioned excellent semiconductor device can be produced.

12 Claims, 4 Drawing Sheets

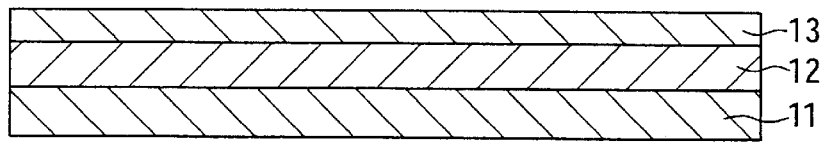
FIG. 3A
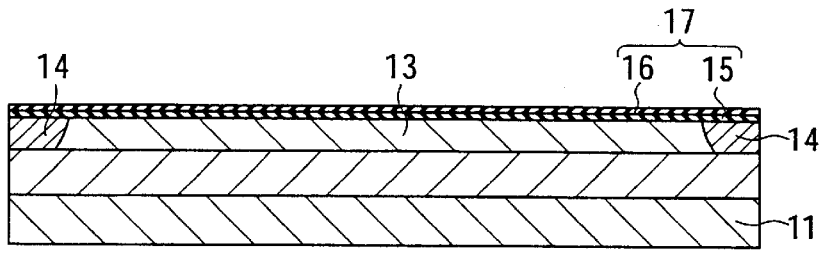
FIG. 3B
FIG. 3C
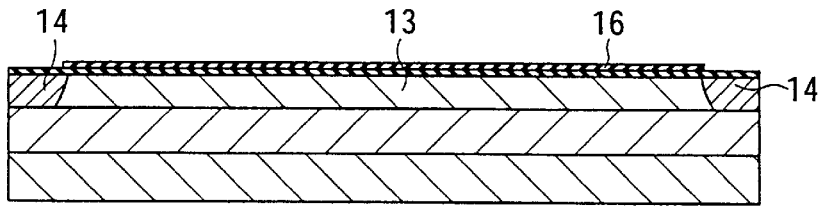
FIG. 3D
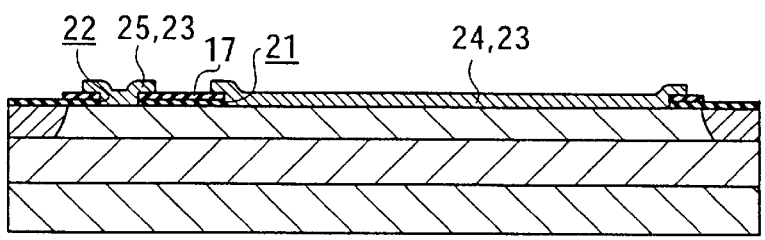
FIG. 3E
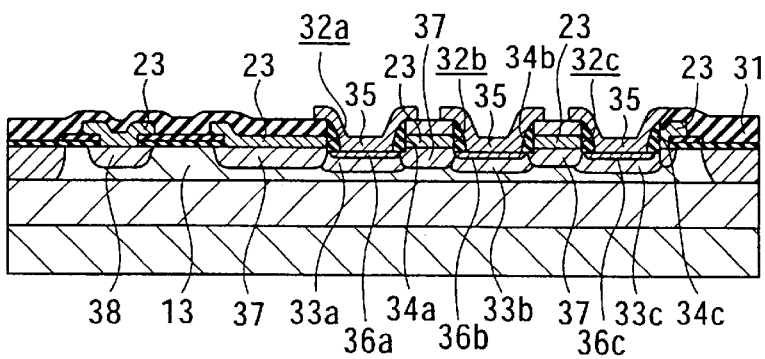
FIG. 3F
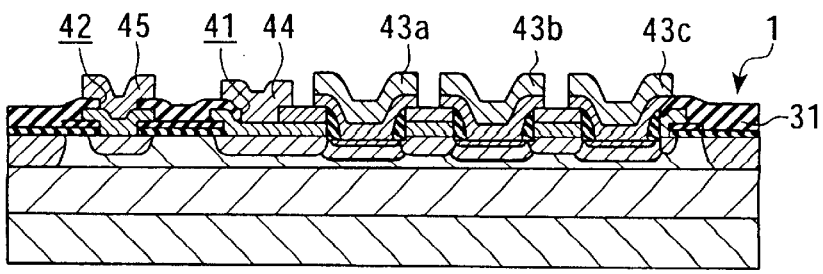

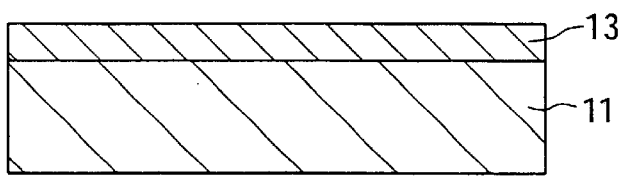
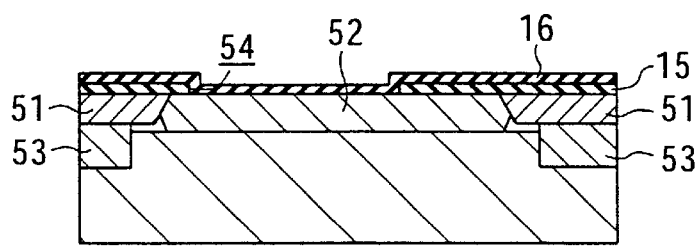
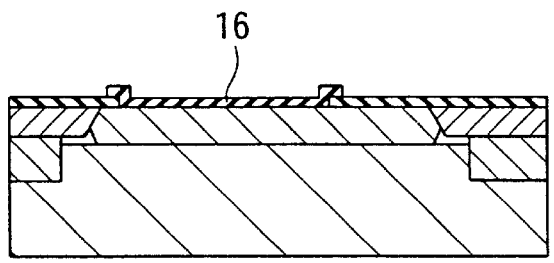
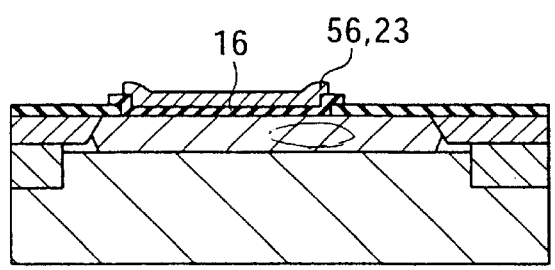
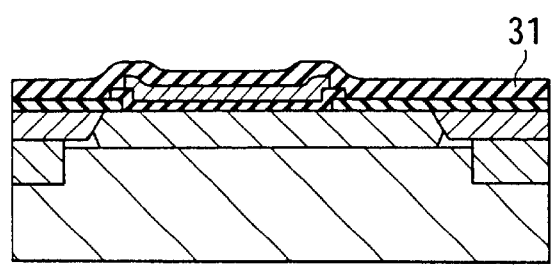
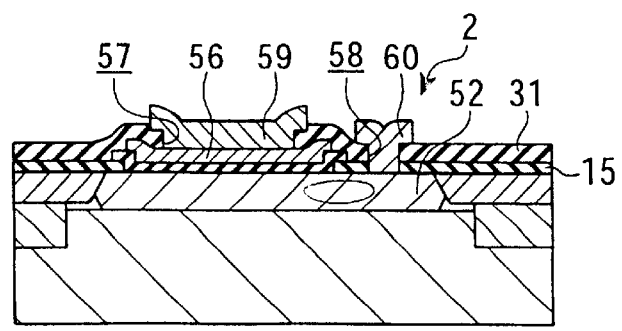
FIG. 4A
FIG. 4B
FIG. 4C
FIG. 4D
FIG. 4E
FIG. 4F

SEMICONDUCTOR DEVICE FOR INTEGRATED INJECTION LOGIC CELL AND PROCESS FOR FABRICATING THE SAME

RELATED APPLICATION DATA

The present application claims priority to Japanese Application No. P2000-028531 filed Feb. 7, 2000, which application is incorporated herein by reference to the extent permitted by law.

BACKGROUND OF THE INVENTION

1. Field of the Invention

The present invention relates to a semiconductor device for an integrated injection logic cell and a process for fabricating the same. More particularly, the present invention is directed to a semiconductor device which realizes, for example, an integrated injection logic cell having a silicon nitride film, and a process for fabricating the same.

2. Description of the Related Art

A non-examined Japanese Laid-Open Publication No. 8,316,333 (corresponding to U.S. Pat. No. 6,008,524) discloses an example of an IIL (Integrated Injection Logic) cell which is realized by using an emitter-base self-alignment bipolar transistor in which a base electrode and an emitter electrode of the bipolar transistor are formed from a first semiconductor thin film and a second semiconductor thin film, respectively.

However, in this IIL cell, a diffused layer, which corresponds to a base region of a pnp bipolar transistor of the IIL cell, generally has a low impurity concentration as low as $1\times10^{15}$ to $1\times10^{16}$ counts/cm$^3$. The reason for this is explained as follow. When the impurity concentration of the diffused layer is higher than the above mentioned value, an $h_{fe}$, i.e., a current amplification factor of the bipolar transistor is lowered, so that an injection current which flows through the base region is difficult to flow and the operation of the IIL cell becomes difficult. On the other hand, if the impurity concentration of the diffused layer is lower than the above value, an operating speed of the IIL cell itself is disadvantageously lowered. For this reason, the impurity concentration of the diffused layer of the bipolar transistor is typically set within the above mentioned range. As mentioned above, however, resultantly the impurity concentration of the diffused layer has to be relatively low. Therefore, the property of the pnp bipolar transistor is very sensitive to the surface state, and particularly, non-uniformity in the properties among semiconductor chips remarkably occurs due to contamination and damage caused during the steps for processing a conductive layer and for processing a wiring. Further, a problem about the deterioration of the reliability often occurs.

In this situation, the present inventor has made extensive and intensive studies with a view toward solving the above-mentioned problems accompanying the conventional art. As a result, it has unexpectedly been found that, in a semiconductor device which comprises an integrated injection logic cell having a pnp bipolar transistor structure formed on a semiconductor substrate, wherein at least one of insulating films formed on a base region of the pnp bipolar transistor structure is comprised of a silicon nitride film. As the silicon nitride film advantageously prevents an occurrence of contamination on the surface of the base region of the pnp bipolar transistor, so that both the properties of the pnp bipolar transistor and the operation of the IIL cell can be stabilized.

SUMMARY OF THE INVENTION

Accordingly, it is an object of the present invention to provide a semiconductor device for an IIL (Integrated Injection Logic) cell having a bipolar transistor structure which is advantageous in that an occurrence of contamination on the surface of a base region of the bipolar transistor structure is prevented by providing a silicon nitride film, so that both the properties of the pnp bipolar transistor and accordingly the operation of the IIL cell are stabilized.

It is another object of the present invention to provide a process for fabricating the above-mentioned semiconductor device for the IIL cell. According to the process for fabricating the semiconductor device for IIL cell having a pnp bipolar transistor formed on a semiconductor substrate, one of insulating layers, which are formed on a base region of the pnp bipolar transistor, is made of a silicon nitride film. As the insulating layers for the base region of the pnp bipolar transistor are formed to include the silicon nitride film, so that a contamination at a surface of the base region of the IIL device can be avoided. Further in the successive process of the fabrication, a damage to the base region of the pnp bipolar transistor can be avoided by the silicon nitride film, and thereby both the properties of the pnp bipolar transistor and accordingly the operation of the IIL cell are stabilized.

BRIEF DESCRIPTION OF THE DRAWINGS

The foregoing and other objects, features and advantages of the present invention will be apparent to those skilled in the art from the following description of the presently preferred exemplary embodiments of the invention taken in connection with the accompanying drawings, in which:

FIGS. 3A to 3F are diagrammatic cross-sectional views showing a process for fabricating a semiconductor device according to one embodiment of the present invention; and FIGS. 4A to 4F are diagrammatic cross-sectional views showing a process for fabricating a semiconductor device according to another embodiment of the present invention, in which a capacitive element is formed.

DETAILED DESCRIPTION OF THE PREFERRED EMBODIMENT

Hereinbelow, one preferred embodiment of a semiconductor device for an IIL (Integrated Injection Logic) cell according to the present invention will be described in detail with reference to the diagrammatic cross-sectional view of FIG. 1 and the top view for the layout of FIG. 2, but the embodiment should not be construed as limiting the scope of the present invention.

Figure 1:
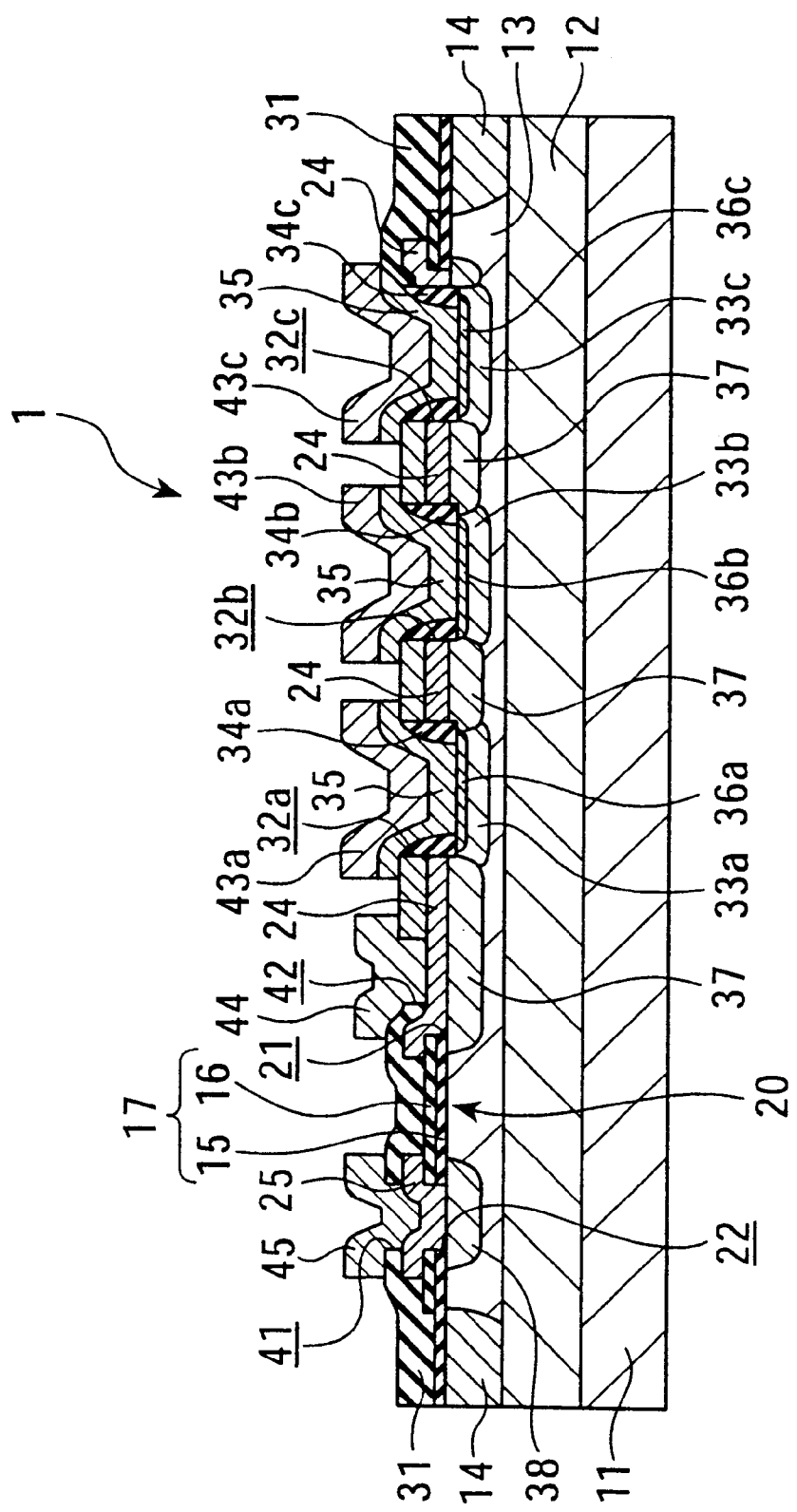
FIGS. 1 is a diagrammatic cross-sectional view showing a semiconductor device according to one embodiment of the present invention.
Figure 2:
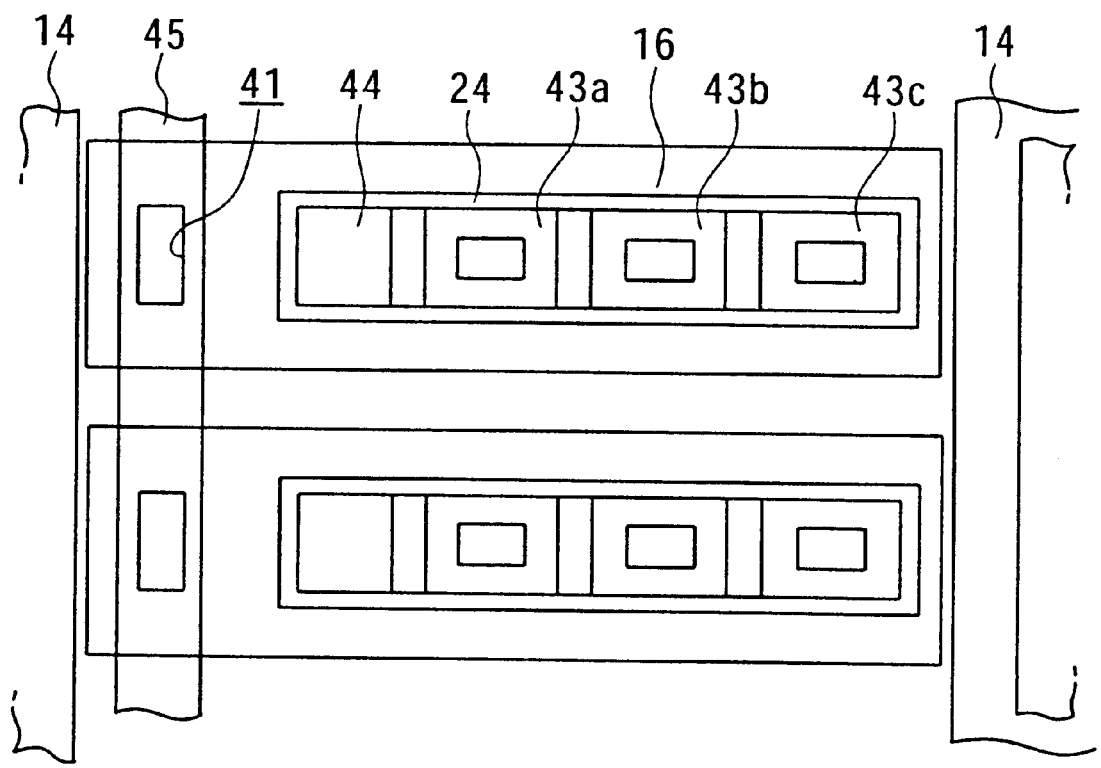
FIG. 2 is a top view showing the layout of a semiconductor device according to one embodiment of the present invention.

As shown in FIGS. 1 and 2, an n-type buried layer 12 doped with an n-type impurity in a high concentration is formed on a surface of a semiconductor substrate 11 which is comprised of a p-type single crystalline silicon substrate. Further, an n-type epitaxial layer 13 having a resistivity of 0.3 to 5.0 Ωcm and having a thickness of 0.5 to 2.5 μm is formed on the semiconductor substrate 11. Hereinafter, the semiconductor substrate 11 containing the n-type epitaxial layer 13 is referred to as "semiconductor substrate 11". In addition, in another region, although not shown, a local oxidation of silicon (hereinafter, frequently referred to simply as "LOCOS") oxide film is formed in a device isolation region.

An n+ plug region 14 connected to the n-type buried layer 12 is formed on the n-type epitaxial layer 13. A p-type channel stopper region is formed under the LOCOS oxide film in the device isolation region. In addition, a silicon oxide film 15 having a thickness of about 50 to 300 nm is deposited on the surface of the semiconductor substrate 11, and further, a silicon nitride film 16 having a thickness of about 20 to 100 nm is deposited on the silicon oxide film 15 and on a base region (corresponding to the region containing the intrinsic base regions 33a, 33b, 33c, a graft base region 37, and an injector region 38 described below). Thus, at least one layer of an insulating film 17 is formed from silicon nitride film.

Opening portions 21, 22 are formed through the insulating film 17 on the graft base region 37 and the injector region 38 described below. In the opening portion 21, a base electrode taking-out portion 24 connected to the graft base region 37 is formed from a first semiconductor layer, and, in the opening portion 22, an injector electrode taking-out portion 25 connected to the injector region 38 is formed also from the first semiconductor layer. This first semiconductor layer contains, for example, a p-type impurity in a high concentration, and is formed from, for example, a p-type (p+) polysilicon layer having a thickness of about 80 to 250 nm.

Further, an insulating film 31 is formed on the entire surface from, for example, a silicon oxide film having a thickness of about 200 to 500 nm. Opening portions 32a, 32b, 32c for the intrinsic base regions are formed in the insulating film 31. Further, the intrinsic base regions 33a, 33b, 33c having introduced into a p-type impurity are formed in the n-type epitaxial layer 13 under the opening portions 32a, 32b, 32c.

Sidewalls 34a, 34b, 34c comprised of, for example, a silicon oxide film is formed on a respective sidewall portion of the opening portions 32a, 32b, 32c. These sidewalls 34a, 34b, 34c serve as spacers between the collector and the base of the IIL cell.

Diffused collector layers 36a, 36b, 36c are formed on the upper layers of the intrinsic base regions 33a, 33b, 33c under the opening portions 32a, 32b, 32c. Further, in the opening portions 32a, 32b, 32c, a second semiconductor layer 35 connected to the diffused collector layers 36a, 36b, 36c is formed from, for example, an n-type (n+) polysilicon layer having a thickness of about 80 to 250 nm. In addition, collector electrodes 43a, 43b, 43c are formed on the second semiconductor layer 35 from, for example, a laminate film of a barrier metal and an aluminum alloy.

The graft base region 37 and the diffused injector layer 38 in which a p-type impurity is diffused to the semiconductor (i.e., the n-type epitaxial layer 13) from the p+ polysilicon in the first semiconductor layer (the base electrode taking-out portion 24 and the injector electrode taking-out portion 25) are formed. Further, opening portions 41, 42 for an injector electrode portion and a base electrode portion are formed through the insulating film 31, and a base electrode 44 and an injector electrode 45 respectively connected to the graft base region 37 and the diffused injector layer 38 through the opening portions 41, 42 are formed from, for example, a laminate film of a barrier metal and an aluminum alloy.

As mentioned above, an IIL cell 1 which is a semiconductor device is constructed.

In the above semiconductor device, the base and the collector of the IIL cell 1 are formed by the self-alignment of p+ polysilicon and n+ polysilicon. In addition, in the IIL cell 1, on the surface of a base region 20 of the pnp bipolar transistor, the insulating film 17 having a laminate structure comprising the silicon oxide film 15 and the silicon nitride film 16. Further, in another region, as the insulating film 17 containing no silicon nitride film, for example, only the silicon oxide film 15 is formed. Therefore, it is possible to prevent an occurrence of contamination on the surface of the base region of the pnp bipolar transistor of the IIL cell 1. In addition, when hydrogen is diffused to the semiconductor substrate 11 during a thermal treatment, such as sintering, the dangling bond in the interface between the semiconductor substrate 11 and the insulating film 17 is buried, so that the properties of the pnp bipolar transistor are stabilized, thus rendering it possible to stabilize the operation of the IIL cell 1.

Next, one preferred embodiment of a process for fabricating a semiconductor device according to the present invention will be described in detail with reference to the diagrammatic cross-sectional views of FIGS. 3A to 3F illustrating a production process. FIGS. 3A to 3F show a production process for an IIL cell. In FIG. 1, FIG. 2 and FIGS. 3A to 3F, like parts or portions are indicated by like reference numerals.

As shown in FIG. 3A, a surface of a semiconductor substrate 11 comprised of a p-type single crystalline silicon substrate is doped with an n-type impurity in a high concentration by, for example, an ion implantation process, to thereby form an n-type buried layer 12. Further, an n-type epitaxial layer 13 having a resistivity of 0.3 to 5.0 Ωcm and having a thickness of 0.5 to 2.5 μm is formed on the semiconductor substrate 11 by an epitaxial growth process. Hereinafter, the semiconductor substrate 11 containing the n-type epitaxial layer 13 is referred to as "the semiconductor substrate 11". Then, although not shown, in another region, a LOCOS oxide film is formed in a device isolation region.

Then, as shown in FIG. 3B, an n+ plug region 14 connected to the n-type buried layer 12 is formed on the n-type epitaxial layer 13 by an ion implantation process. Subsequently, although not shown, a p-type channel stopper region is formed under the LOCOS oxide film in the device isolation region by an ion implantation process. Further, a silicon oxide film 15 is deposited on the surface of the semiconductor substrate 11 by a chemical vapor deposition (hereinafter, frequently referred to simply as "CVD") process so that the thickness of the resultant film becomes about 50 to 300 nm. Further, a silicon nitride film 16 is deposited on the silicon oxide film 15 by a CVD process so that the thickness of the resultant film becomes about 20 to 100 nm. Thus, at least one layer of insulating film 17 is formed from silicon nitride film.

Then, as shown in FIG. 3C, the silicon nitride film 16 on the n+ plug region 14 is removed using a lithography technique and a dry etching technique, thus forming a structure such that the silicon nitride film 16 remains only on the n-type epitaxial layer 13 exclusive of the n+ plug region 14. Accordingly, a base-forming region on which a graft base region and an intrinsic base region will be formed is coated with the silicon nitride film 16.

Then, as shown in FIG. 3D, opening portions 21, 22 are formed in a part of the insulating film 17 on the base-forming region and the injector forming region of the IIL cell. Then, a first semiconductor layer 23 is formed from, for example, a polysilicon layer having a thickness of about 80 to 250 nm. The polysilicon layer constituting the first semiconductor layer 23 is a polysilicon layer which is doped with a p-type impurity during the deposition of the polysilicon layer by a CVD process, or one which is obtained by a method in which a polysilicon layer is first deposited by a CVD process, and then, boron ions (B$^+$) or boron difluoride ions (BF$_2^+$) are implanted into the deposited polysilicon layer by an ion implantation process, to thereby form a polysilicon layer containing a p-type impurity in a high concentration. Subsequently, the first semiconductor layer 23 is processed by a lithography technique and a reactive ion etching (hereinafter, frequently referred to simply as "RIE") process, to thereby form a base electrode taking-out portion 24 and an injector electrode taking-out portion 25 of the IIL cell.

Then, as shown in FIG. 3E, for example, a silicon oxide film is deposited on the entire surface so as to have a thickness of about 200 to 500 nm, to thereby form an insulating film 31. If desired, the resultant film may be subjected to a thermal treatment to promote the growth of the crystal of p$^+$ polysilicon in the first semiconductor layer 23, thus lowering the resistivity and improving the uniformity. Subsequently, the opening portions 32a, 32b, 32c for the intrinsic base-forming regions of the IIL cell are formed in the insulating film 31 and the like by a lithography technique and an RIE process.

Further, a p-type impurity is introduced into the n-type epitaxial layer 13 through the opening portions 32a, 32b, 32c, to thereby form the intrinsic base regions 33a, 33b, 33c. The introduction of the p-type impurity is conducted by, for example, an ion implantation process. In this case, conditions for the ion implantation process are, for example, such that boron difluoride (BF$_2$) is used as a p-type impurity, the implant energy is 5 to 200 keV, and the dose is 5.0×10$^{11}$ to 5.0×10$^{14}$ counts/cm$^2$. Alternatively, a vapor phase diffusion process can be employed.

Then, as an insulating film for forming sidewalls, for example, a silicon oxide film is deposited so as to have a thickness of about 400 to 1,000 nm by a CVD process, and then, the resultant silicon oxide film is etched back by an RIE process, to thereby form sidewalls 34a, 34b, 34c comprised of a silicon oxide film on a respective sidewall portion of the opening portions 32a, 32b, 32c. These insulating films serve as spacers between the collector and the base of the IIL cell.

Next, a second semiconductor layer 35 is formed on the entire surface on the side of the insulating film 31 from, for example, an n-type polysilicon layer having a thickness of about 80 to 250 nm. As examples of the method for forming this layer, there can be mentioned a method in which polysilicon containing an n-type impurity, such as phosphorus (P) or arsenic (As), is deposited by a CVD process, and a method in which polysilicon containing no impurity is first deposited, and then, an n-type impurity such as P or As, is implanted into the polysilicon deposited by an ion implantation process.

Then, although not shown, a silicon oxide film is deposited on the entire surface so as to have a thickness of, for example, 100 to 500 nm, and subjected to a thermal treatment at, for example, 700 to 1,200° C. for 5 seconds to 2 hours which varies depending on the heating temperature and the heating method, so that an n-type impurity is diffused to the semiconductor (i.e., the intrinsic base regions 33a, 33b, 33c formed in the n-type epitaxial layer 13) from the n-type polysilicon in the second semiconductor layer 35, to thereby form diffused collector layers 36a, 36b, 36c of the IIL cell. Further, a p-type impurity is diffused to the semiconductor (i.e., the n-type epitaxial layer 13) from the p$^+$ polysilicon in the first semiconductor layer 23 (the base electrode taking-out portion 24 and the injector electrode taking-out portion 25), to thereby form a graft base region 37 and an diffused injector layer 38 of the IIL cell.

Then, as shown in FIG. 3F, the insulating film 31 is processed by a lithography technique and an etching technique, to thereby form opening portions 41, 42 for an injector electrode portion and a base electrode portion of the IIL cell. Further, a barrier metal and an aluminum alloy are deposited thereon by a sputtering process or the like, and then, processing for wirings is conducted, to thereby form collector electrodes 43a, 43b, 43c, a base electrode 44, and an injector electrode 45. Thus, an IIL cell 1 is formed.

In the above process for fabricating a semiconductor device, by virtue of forming the silicon nitride film 16, it is possible to prevent an occurrence of contamination on the surface of the base region of the pnp bipolar transistor of the IIL cell. In addition, the base region is prevented from suffering a damage during the steps for fabrication. Further, when hydrogen is diffused to the semiconductor substrate 11 from the region in which the silicon nitride film 16 is not formed, i.e., the region in which the insulating film 17 is formed from only the silicon oxide film 15 during a thermal treatment, such as sintering, the dangling bond in the interface between the semiconductor substrate 11 and the insulating film 17 is buried. Therefore, the properties of the pnp bipolar transistor can be stabilized, thus making it possible to stabilize the operation of the IIL cell.

Further, the above-mentioned silicon nitride film can also be used as a dielectric film for a capacitive element. The production process in such a case is described below with reference to the diagrammatic cross-sectional views of FIGS. 3A to 3F and FIGS. 4A to 4F illustrating production processes. FIGS. 4A to 4F show a production process in connection with only the region on which a capacitive element is formed. Further, in the description below, a process in which a capacitive element is formed by conducting the process shown in FIGs. 3A to 3F is explained mainly on the formation process for the capacitive element.

In the step described above with reference to FIG. 3A, as shown in FIG. 4A, an n-type epitaxial layer 13 is formed on a semiconductor substrate 11 which is comprised of a p-type silicon substrate. In the region on which a capacitive element is formed, the n-type buried layer 12 described above with reference to FIG. 3A is not formed.

Then, as shown in FIG. 4B, a LOCOS oxide film 51 is formed in a device isolation region. Subsequently, an n$^+$ diffused layer 52 is formed when forming the no plug region 14 described above with reference to FIG. 3B. Further, a channel stopper region 53 is formed under the LOCOS oxide film 51 in the device isolation region by an ion implantation process.

Next, the silicon oxide film 15 described above with reference to FIG. 3B is deposited on the surface of the semiconductor substrate 11 so as to have a thickness of, for example, about 50 to 300 nm. Then, before forming a silicon nitride film 16, an opening portion 54 is formed in the portion of the silicon oxide film 15, on which the capacitive element is formed, by a lithography technique and an etching technique. Then, the silicon nitride film 16 is deposited by a CVD process so as to have a thickness of about 20 to 100 nm. The silicon nitride film 16 serves as a dielectric film for the capacitive element.

Then, as shown in FIG. 4C, the silicon nitride film 16 is subjected to patterning so as to be a dielectric film for the capacitive element by a lithography technique and an etching technique.

Then, as shown in FIG. 4D, the first semiconductor layer 23 described above with reference to FIG. 3D is formed by a CDV process. Subsequently, the base electrode taking-out portion 24 and the injector electrode taking-out portion 25 are formed by patterning using a lithography technique and an etching technique, and at the same time, an upper electrode 56 for the capacitive element is formed on the silicon nitride film 16.

Then, as shown in FIG. 4E, an insulating film 31 is formed from, for example, a silicon oxide film so as to have a thickness of about 200 to 500 nm in the same manner as in the description above with reference to FIG. 3E.

Then, as shown in FIG. 4F, the opening portions 41, 42 described above with reference to FIG. 3F are formed, and at the same time, an opening portion 57 for an upper electrode portion is formed in the insulating film 31. Further, an opening portion 58 for a lower electrode portion is formed in the insulating film 31 and the silicon oxide film 15. Then, a barrier metal layer and an aluminum alloy film are formed by a film deposition technique, such as a sputtering process, in the same manner as in the description above with reference to FIG. 3F. Then, processing for wirings is conducted, to thereby form a wiring 59 connected to the upper electrode 56, and a lower electrode 60 connected to the $n^+$ diffused layer 52, thus constituting a capacitive element 2.

In the embodiment described above with reference to FIGS. 4A to 4F, the silicon nitride film 16 serves as a dielectric film for the capacitive element 2. Therefore, it becomes possible to form the silicon nitride film 16 described above with reference to FIGS. 3A to 3F without increasing the number of the steps for production.

As mentioned above, in the semiconductor device of the present invention, at least one layer of the insulating films formed on the base region of the pnp bipolar transistor of an IIL cell is formed from a silicon nitride film. Therefore, the silicon nitride film prevents an occurrence of contamination on the surface of the base region, so that both the properties of the pnp bipolar transistor and the operation of the IIL can be stabilized.

Further, by the process for fabricating a semiconductor device of the present invention, in the formation of insulating films on a semiconductor substrate, at least one layer of the insulating films on the base region of the pnp bipolar transistor is formed from a silicon nitride film. Therefore, it is possible to prevent an occurrence of contamination on the surface of the base region of the pnp bipolar transistor of the IIL cell. Further, in the steps subsequent to the step for forming the silicon nitride film, the base region hardly suffers a damage due to the silicon nitride film. That is, by the process of the present invention, it is possible to produce a semiconductor device which is advantageous in that both the properties of the pnp bipolar transistor and the operation of the IIL cell are stabilized.

What is claimed is:

1. A semiconductor device for an integrated injection logic cell having a pnp bipolar transistor structure formed on a substrate, the semiconductor device comprising:
   a first insulating film formed above a plug region, the first insulating film comprising a silicon oxide film; and
   a second insulating film formed above a base region of said pnp bipolar transistor structure but not above the plug region, the first insulating film comprising a silicon nitride film.

2. The semiconductor device according to claim 1, wherein
   an insulating film formed on a plug region of said integrated injection logic cell is comprised of a silicon oxide film.

3. The semiconductor device according to claim 1, further comprising:
   a capacitive element, wherein a dielectric film of said capacitive element is formed from the same silicon nitride film layer as said silicon nitride film.

4. The semiconductor device according to claim 1, wherein
   said base region of said pnp transistor structure has an impurity concentration of approximately $1\times10^{15}$ to $1\times10^{16}$ counts/cm$^3$.

5. A semiconductor device according to claim 1, wherein each of the two plug regions is an $n^+$ plug region.

6. A semiconductor device according to claim 1 wherein the second insulating layer is formed by depositing a layer of silicon nitride on top of the first insulating layer and then etching portions of the second insulating layer that are above the two plug regions.

7. A semiconductor device for an integrated injection logic cell having a pnp bipolar transistor structure formed on a semiconductor substrate, the semiconductor device comprising:
   a base region of said pnp bipolar transistor structure having an impurity concentration of approximately $1\times10^{15}$ to $1\times10^{16}$ counts/cm$^3$;
   a first insulating film formed above a plug region, the first insulating film comprising a silicon oxide film; and
   a second insulating film formed above a base region of said pnp bipolar transistor structure but not above the plug region, the first insulating film comprising a silicon nitride film.

8. The semiconductor device according to claim 7, wherein
   an insulating film formed on a plug region of said integrated injection logic cell is comprised of a silicon oxide film.

9. The device according to claim 7, which further comprises a capacitive element, wherein a dielectric film of said capacitive element is formed from the same silicon nitride film layer as said silicon nitride film.

10. A semiconductor device according to claim 7, wherein each of the two plug regions is an $n^+$ plug region.

11. A semiconductor device according to claim 7 wherein the second insulating layer is formed by depositing a layer of silicon nitride on top of the first insulating layer and then etching portions of the second insulating layer that are above the two plug regions.

12. A semiconductor device for an integrated injection logic cell having a pnp bipolar transistor structure formed on a semiconductor substrate, the semiconductor device comprising:
   a first insulating film formed above a plug region and a base region of said pnp bipolar transistor structure, the first insulating film comprising a silicon oxide film;
   a second insulating film formed above the base region but not above the plug region, the first insulating film comprising a silicon nitride film; and
   wherein said first insulating film is formed by depositing silicon oxide on top of said base and said plug region using chemical vapor deposition; and said second insulating film is formed by depositing silicon nitride on top of said first insulating film using chemical vapor deposition.

* * * * *